US011716874B2

(12) United States Patent
Li et al.

(10) Patent No.: US 11,716,874 B2
(45) Date of Patent: Aug. 1, 2023

(54) DISPLAY PANEL WITH ORGANIC ELECTROLUMINESCENT DEVICE LAYER AND COLOR SWITCHABLE STRUCTURE, DISPLAY DEVICE AND DISPLAY METHOD

(71) Applicants: Beijing BOE Display Technology Co., Ltd., Beijing (CN); BOE Technology Group Co., Ltd., Beijing (CN)

(72) Inventors: Yanqiu Li, Beijing (CN); Juan Yu, Beijing (CN)

(73) Assignees: Beijing BOE Display Technology Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 495 days.

(21) Appl. No.: 16/835,470

(22) Filed: Mar. 31, 2020

(65) Prior Publication Data

US 2021/0098542 A1    Apr. 1, 2021

(30) Foreign Application Priority Data

Sep. 29, 2019   (CN) .......................... 201910936352.0

(51) Int. Cl.
*H10K 59/00*      (2023.01)
*G02F 1/1337*     (2006.01)
(Continued)

(52) U.S. Cl.
CPC .............. *H10K 59/00* (2023.02); *C09K 11/06* (2013.01); *C09K 19/0208* (2013.01);
(Continued)

(58) Field of Classification Search
CPC combination set(s) only.
See application file for complete search history.

(56) References Cited

U.S. PATENT DOCUMENTS 9,590,208 B2    3/2017  Niu et al.
2002/0031621 A1* 3/2002  Prechtl .................. C09K 19/00
                                              252/299.61
(Continued)

FOREIGN PATENT DOCUMENTS

CN        10-2597862    *  7/2012  ........... G02F 1/1337
CN        104471733 A      3/2015
(Continued)

OTHER PUBLICATIONS

Office Action for corresponding Chinese application No. 201910936352.0 dated Jul. 23, 2021.

*Primary Examiner* — Lauren Nguyen
(74) *Attorney, Agent, or Firm* — ArentFox Schiff LLP; Michael Fainberg

(57) ABSTRACT

The present disclosure provides a display panel, a display device and a display method. The display panel includes a base substrate, and an organic electroluminescent device layer, a detection sensor and a color switchable structure which are successively located on the base substrate and are insulated from each other, where the organic electroluminescent device layer includes a plurality of sub-pixels, and the color switchable structure includes sub-units disposed in one-to-one correspondence with the sub-pixels; the sub-units are configured to transmit light emitted by the sub-pixels under the control of applied different signals, or to display light of colors corresponding to the applied signals; and the detection sensor is configured to detect display parameters of the sub-pixels or the sub-units.

5 Claims, 4 Drawing Sheets

(51) Int. Cl.
- *G02F 1/137* (2006.01)
- *C09K 11/06* (2006.01)
- *C09K 19/02* (2006.01)
- *G09G 3/06* (2006.01)
- *H10K 59/50* (2023.01)
- *H10K 71/00* (2023.01)

(52) U.S. Cl.
CPC ........ *G02F 1/1337* (2013.01); *G02F 1/13718* (2013.01); *G09G 3/06* (2013.01); *H10K 59/50* (2023.02); *H10K 71/00* (2023.02)

(56) References Cited

U.S. PATENT DOCUMENTS

| | | |
|---|---|---|
| 2013/0240851 A1 | 9/2013 | Seo et al. |
| 2016/0109740 A1 | 4/2016 | Lee et al. |
| 2018/0150164 A1 | 5/2018 | Naganuma |
| 2018/0217438 A1 | 8/2018 | Niu et al. |
| 2018/0224678 A1* | 8/2018 | Jung ................... G02F 1/13318 |
| 2019/0056612 A1 | 2/2019 | Li et al. |
| 2020/0075570 A1 | 3/2020 | Wang et al. |

FOREIGN PATENT DOCUMENTS

| | | | |
|---|---|---|---|
| CN | 106200148 A | 12/2016 | |
| CN | 107394050 A | 11/2017 | |
| CN | 107450223 A | 12/2017 | |
| CN | 107949805 A | 4/2018 | |
| CN | 207216229 U | 4/2018 | |
| CN | 109166892 A | 1/2019 | |
| GB | 2-279072 | * 12/1994 | ............. C07B 37/10 |

\* cited by examiner

DISPLAY PANEL WITH ORGANIC ELECTROLUMINESCENT DEVICE LAYER AND COLOR SWITCHABLE STRUCTURE, DISPLAY DEVICE AND DISPLAY METHOD

This application claims priority to Chinese Patent Application No. 201910936352.0, filed on Sep. 29, 2019, which is hereby incorporated by reference in its entirety.

FIELD

The present disclosure relates to the field of display, and in particular, to a display panel, a display device and a display method.

BACKGROUND

Compared with a traditional liquid crystal display panel, an organic light-emitting display panel does not need a backlight module, and uses a very thin organic material coating and a glass substrate (or a flexible organic substrate). When an electric current flows therethrough, organic materials emit light. Furthermore, the organic light-emitting display panel not only is lighter and thinner, has low energy consumption and high brightness and luminance, and can display pure black, but also can be bent, so the organic light-emitting display panel is now applied more and more widely in the fields of televisions, computers (displays), mobile phones, tablets and the like.

The organic light-emitting display panel in the related art comprises a base substrate, and a first electrode, an organic light-emitting layer and a second electrode which are successively located on the base substrate, and the organic light-emitting layer emits light under the drive of a voltage applied to the first electrode and the second electrode. The organic light-emitting layer mainly uses a red fluorescent material, a green fluorescent material and a blue phosphorescent material to emit light which is mixed into white light. At present, the blue phosphorescent material has a short life because blue light has high photon energy and is liable to cause material attenuation. Thus, the attenuation of lifetime of a blue light emitting device can cause failure of the entire organic light-emitting display panel, such that normal display cannot be implemented.

SUMMARY

Embodiments of the present disclosure provide a display panel, a display device and a display method.

In a first aspect, an embodiment of the present disclosure provides a display panel, including: a base substrate, and an organic electroluminescent device layer, a detection sensor and a color switchable structure which are successively located on the base substrate and are insulated from each other.

The organic electroluminescent device layer includes a plurality of sub-pixels, and the color switchable structure includes a plurality of sub-units disposed in one-to-one correspondence with the plurality of sub-pixels.

The plurality of sub-units are configured to transmit light emitted by the plurality of sub-pixels under the control of applied different signals, or to display light of colors corresponding to the applied signals.

The detection sensor is configured to detect display parameters of the plurality of sub-pixels or the plurality of sub-units.

In a possible implementation, in the display panel provided by the embodiment of the present disclosure, the color switchable structure further includes: a first electrode layer, a first alignment layer, a cholesteric liquid crystal layer, a second alignment layer and a second electrode layer which are successively located on a side of the detection sensor away from the base substrate, where the second electrode layer includes a plurality of electrodes arranged in an array, and the plurality of electrodes are respectively disposed corresponding to the plurality of sub-units; and the cholesteric liquid crystal layer is doped with a single-electron oxidant and a first compound that influences spiral shapes of liquid crystal molecules, and concentrations of the first compound doped in the cholesteric liquid crystal layer corresponding to the plurality of sub-units for displaying different colors are not all the same.

In a possible implementation, in the display panel provided by the embodiment of the present disclosure, a concentration of the first compound doped in the cholesteric liquid crystal layer corresponding to sub-units for displaying red is 2.2 mol %; and a concentrations of the first compound doped in the cholesteric liquid crystal layer corresponding to sub-units for displaying green and blue are both 3.0 mol %.

In a possible implementation, in the display panel provided by the embodiment of the present disclosure, the single-electron oxidant includes NOBF4.

In a possible implementation, in the display panel provided by the embodiment of the present disclosure, the first compound includes:

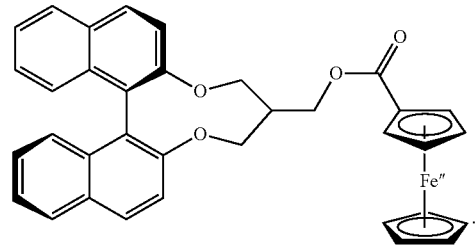

In a second aspect, an embodiment of the present disclosure further provides a display device, including the display panel provided by any embodiment of the first aspect, and a main control circuit.

The main control circuit is electrically connected to the organic electroluminescent device layer, the detection sensor and the color switchable structure, respectively.

The main control circuit is configured to receive a detection signal provided by the detection sensor, and control display states of the organic electroluminescent device layer and the color switchable structure according to the detection signal.

In a third aspect, an embodiment of the present disclosure further provides a display method for the display device, and the method includes: controlling, by a main control circuit, the plurality of sub-pixels in the organic electroluminescent device layer to display; detecting, by a detection sensor, first display parameters corresponding to the sub-pixels; and determining, by the main control circuit, whether the first display parameters meet a first display condition or not, and when the first display parameters do not meet the first display condition, controlling the plurality of sub-pixels to stop displaying, and controlling the plurality of sub-units to display.

In a possible implementation, in the display method for the display device provided by the embodiment of the present disclosure, when the first display parameters are first brightness values corresponding to the plurality of sub-pixels, determining, by the main control circuit, whether the first display parameters meet the first display condition or not, includes: determining, by the main control circuit, whether the first brightness values are smaller than a first threshold or not; and when the first brightness values are smaller than the first threshold, controlling, by the main control circuit, the plurality of sub-pixels to stop display, and controlling the plurality of sub-units to display.

In a possible implementation, in the display method for the display device provided by the embodiment of the present disclosure, the method further includes: after the plurality of sub-units have displayed for a preset period time, controlling, by the main control circuit, the detection sensor to detect second display parameters corresponding to sub-units for displaying blue; determining, by the main control circuit, whether the second display parameters corresponding to the sub-units for displaying blue meets a second display condition or not; and when the second display parameters do not meet the second display condition, switching signals applied to the sub-units for displaying blue and sub-units for displaying green.

In a possible implementation, in the display method for the display device provided by the embodiment of the present disclosure, when the second display parameters are second brightness values corresponding to the sub-units for displaying blue, determining, by the main control circuit, whether the second display parameters corresponding to the sub-units for displaying blue meets the second display condition or not, includes: determining, by the main control circuit, whether the second brightness value are smaller than a second threshold or not; and when the second brightness values are smaller than the second threshold, switching the signals applied to the sub-units for displaying blue and the sub-units for displaying green.

In a possible implementation, in the display method for the display device provided by the embodiment of the present disclosure, the method further includes: while controlling the plurality of sub-units to display, driving, by the main control circuit, the plurality of sub-units to display light with the same color as corresponding sub-units.

DETAILED DESCRIPTION OF THE EMBODIMENTS

Figure 1:
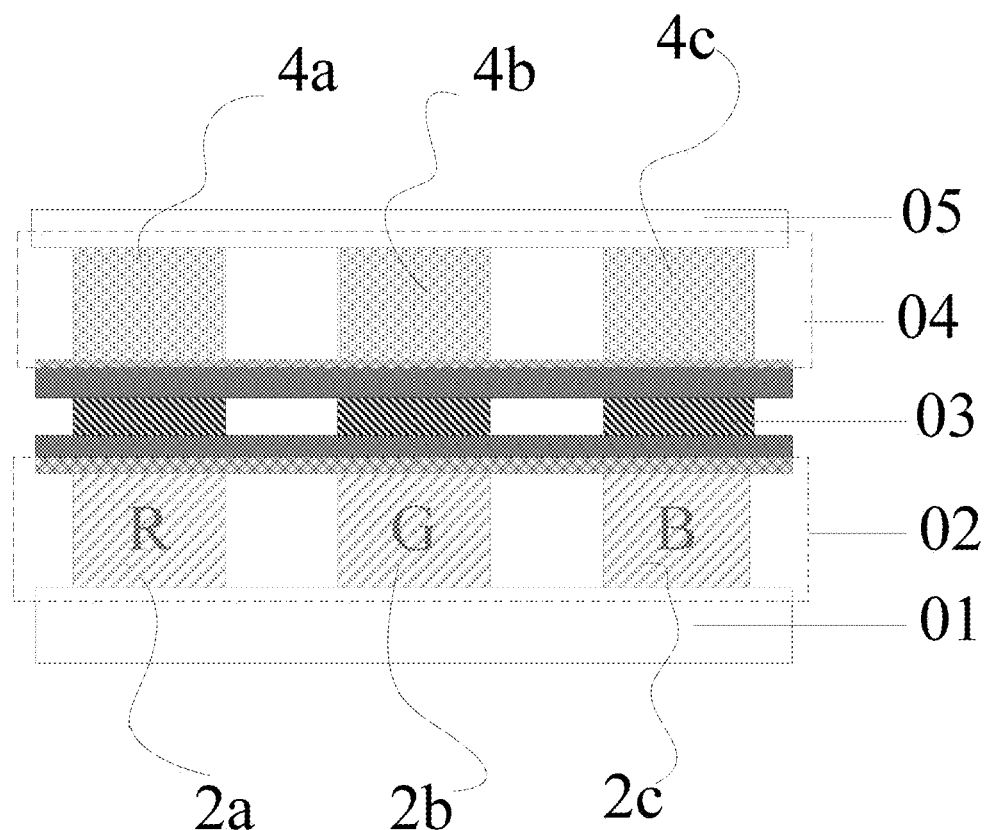
FIG. 1 is a schematic structural diagram of a display panel provided by an embodiment of the present disclosure.

For an organic light-emitting display panel in the related art, due to serious attenuation of a blue light emitting material currently used therein, the display life of the entire display panel is limited.

In view of the foregoing problem of the display panel in the related art, embodiments of the present disclosure provide a display panel, a display device and a display method therefor. To make the objects, technical solutions and advantages of the present disclosure clearer, specific implementations of the display panel, the display device and the display method therefor provided by the embodiments of the present disclosure will be described in detail below with reference to the accompanying drawings. It should be understood that the preferred embodiments described below are only used for illustrating and explaining the present disclosure, and are not intended to limit the present disclosure. Moreover, the embodiments in the present application and the features in the embodiments can be combined with each other without conflicts.

The shapes and sizes of the components in the drawings do not reflect the true scale, and are merely intended to illustrate the present disclosure.

Specifically, an embodiment of the present disclosure provides a display panel, as shown in FIG. 1, the display panel includes a base substrate 01, and an organic electroluminescent device layer 02, a detection sensor 03 and a color switchable structure 04 which are successively located on the base substrate 01 and are insulated from each other.

The organic electroluminescent device layer 02 includes a plurality of sub-pixels (2a, 2b, and 2c). The color switchable structure 04 includes a plurality of sub-units (4a, 4b, and 4c) disposed in one-to-one correspondence with the sub-pixels (2a, 2b, and 2c).

The sub-units (4a, 4b, and 4c) are configured to transmit light emitted by the sub-pixels (2a, 2b, and 2c) under the control of applied different signals, or to display light of colors corresponding to the applied signals.

The detection sensor 03 is configured to detect display parameters of the sub-pixels (2a, 2b, and 2c) or the sub-units (4a, 4b, and 4c).

Specifically, in the display panel provided by the embodiment of the present disclosure, the organic electroluminescent device layer and the color switchable structure can perform display independently, but implement different types of display. The organic electroluminescent device layer can be driven by a driving signal to excite light-emitting layers in the organic electroluminescent device layer to emit light, that is, the organic electroluminescent device layer itself emits the light for display, while the color switchable structure reflects external natural light or the light emitted by the organic electroluminescent device layer to perform display, and the color and gray scale of the displayed light are adjusted by applying different voltages. Therefore, the detection sensor detects display parameters of the electroluminescent device layer, and when the display parameters do not meet a first display condition, the color switchable structure is controlled to perform display, thereby achieving the purpose of prolonging the service life of the display panel.

It should be noted that, in the display panel provided by the embodiment of the present disclosure, the organic electroluminescent device layer and the color switchable structure can perform display separately or simultaneously. When the organic electroluminescent device layer and the color switchable structure display simultaneously, the color gamut of the display can be increased to improve the display quality, and how to control the display order of the organic electroluminescent device layer and the color switchable structure can be determined according to the actual display requirement, and is not specifically limited herein.

The display panel further includes a cover plate 05 located on a side of the color switchable structure 04 away from the substrate 01, and it has the same function as a cover plate in the related art, and is not described in detail herein.

Figure 2:
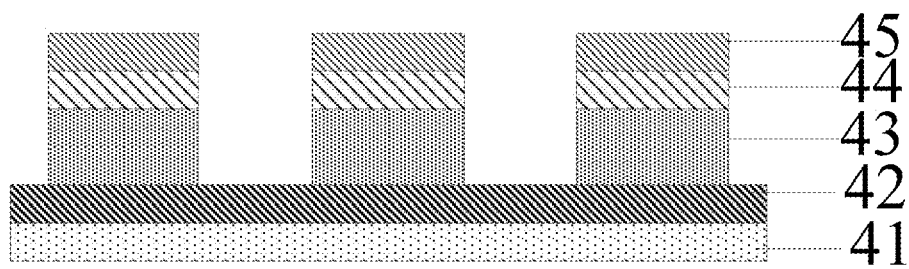
FIG. 2 is a specific structural diagram of a color switchable structure provided by an embodiment of the present disclosure.

Optionally, in the display panel provided by the embodiment of the present disclosure, as shown in FIGS. 1 and 2, the color switchable structure 04 includes: a first electrode layer 41, a first alignment layer 42, a cholesteric liquid crystal layer 43, a second alignment layer 44 and a second electrode layer 45 which are successively located on a side of the detection sensor 03 away from the base substrate 01.

The second electrode layer 45 includes a plurality of electrodes arranged in an array, and the electrodes are respectively disposed corresponding to the sub-units (4a, 4b, and 4c).

The cholesteric liquid crystal layer 43 is doped with a single-electron oxidant and a first compound that influences spiral shapes of liquid crystal molecules, and concentrations of the first compound doped in the cholesteric liquid crystal layer 43 corresponding to the sub-units (4a, 4b, and 4c) for displaying different colors are not all the same.

Specifically, in the display panel provided by the embodiment of the present disclosure, the single-electron oxidant added to cholesteric liquid crystals can oxidize the first compound, so that the first compound influences spiral shapes of the cholesteric liquid crystals, and the cholesteric liquid crystals selectively reflect incident light of a corresponding helical pitch wavelength, and the helical pitch can be determined by a helical twisting force applied to the first compound and its molar fraction. Therefore, by designing the cholesteric liquid crystal layer, light of different wavelengths can be reflected for display.

The first electrode layer, the first alignment layer, the second alignment layer and the second electrode layer all have the same function as a cholesteric liquid crystal display panel in the related art, and are not described in detail herein.

In addition, a corresponding luminescent material can be doped in the corresponding cholesteric liquid crystal, thereby achieving autoluminescence of the color switchable structure.

Optionally, in the display panel provided by the embodiment of the present disclosure, the concentration of the first compound doped in the cholesteric liquid crystal layer corresponding to sub-units for displaying red is 2.2 mol %; and the concentrations of the first compound doped in the cholesteric liquid crystal layer corresponding to sub-units for displaying green and blue are both 3.0 mol %.

Optionally, in the display panel provided by the embodiment of the present disclosure, the single-electron oxidant includes NOBF4.

Optionally, in the display panel provided by the embodiment of the present disclosure, the first compound includes:

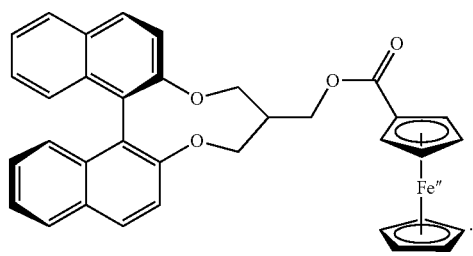

Specifically, the first compound provided by the embodiment of the present disclosure is prepared from a second compound and a third compound, specifically as follows.

Preparation of the second compound:

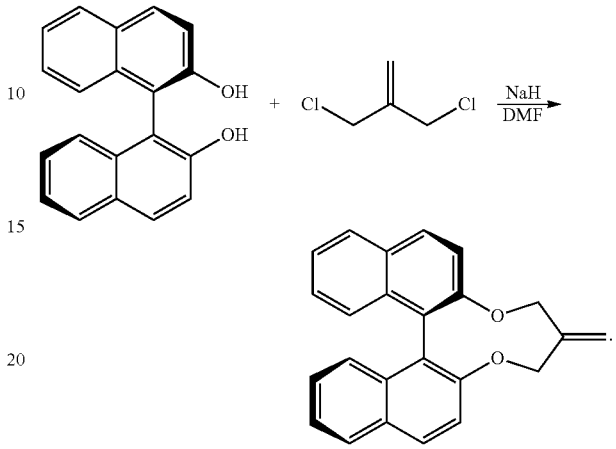

At 0° C., using argon (Ar) or other inert gas as protective gas, 60% NaH mineral oil (0.70 g, 17.5) is added to a Dimethylformamide (DMF) solution (60 mL) of dry (R)-(+)-1,1'-bis (2-naphthol) (2.00 g, 6.99 mmol). In this way, during the experiment, it is possible to avoid experimental errors in the reaction between the substance being tested and the components in the air, such as nitrogen, oxygen, and carbon dioxide, etc.

After stirring at the room temperature for 3 minutes, 3-chloro-2-chloromethyl-1-propene (0.87 g, 7.08 mmol) is added, and the resulting mixture is stirred at 60° C. for 5 minutes. After cooling to the room temperature, the mixture is poured into a saturated aqueous NH₄Cl solution and extracted for 3 times with AcOEt, and combined organic extracts were washed with brine, dried with Na₂SO₄, and evaporated to dryness under reduced pressure.

Pesidue is subjected to column chromatography on silica gel using CH₂Cl₂ as an eluent to separate out a white solid of the second compound.

Preparation of the third compound:

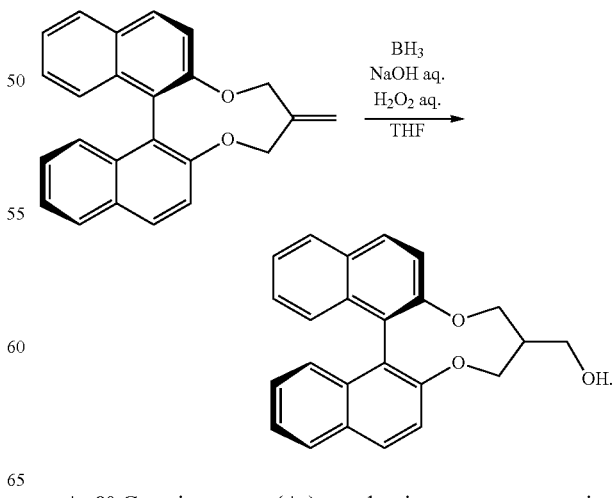

At 0° C., using argon (Ar) or other inert gas as protective gas, a tetrahydrofuran (THF) solution of a BH3-THF complex (0.9M, 5.4 mL, 4.86 mmol) is added to a dry THF solution (10 mL) of the second compound 2 (1.02 g, 3.02 mmol).

After stirring at 0° C. for 10 minutes, an aqueous NaOH solution (3.0M, 1.2 mL, 3.60 mmol) was added to a reaction mixture and stirred at 0° C. for 15 minutes.

Then, an aqueous $H_2O_2$ solution (30%, 1.2 mL) was added to the reaction mixture and stirred at the room temperature for 6 minutes.

Then, $K_2CO_3$ (600 mg) was added to the mixture and stirred for 3 minutes; after the reaction mixture was poured into water and extracted for 3 times with $CH_2Cl_2$, combined organic extracts were washed with brine, dried with $Na_2SO_4$, and evaporated to dryness under reduced pressure.

Residue was subjected to column chromatography on silica gel using hexane/AcOEt (1/1 v/v) as an eluent to separate out white powder of the third compound.

Preparation of the first compound:

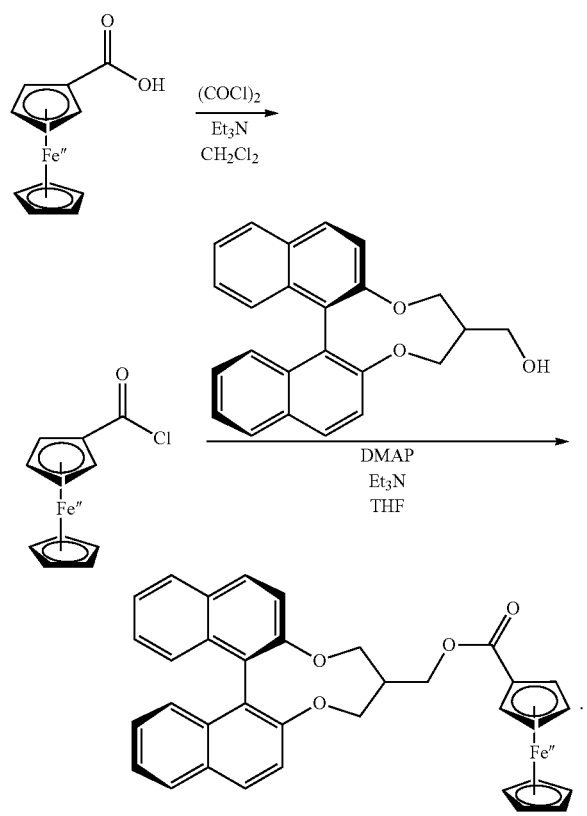

Using argon (Ar) or other inert gas as protective gas, triethylamine (101.6 mg, 1.00 mmol) and oxalyl chloride (767.0 mg, 6.05 mmol) were added to ferrocenecarboxylic acid (236.8 mg, 1.03 mmol) of a dry $CH_2Cl_2$ solution (3.6 mL).

After stirring at the room temperature for 5 minutes, a reaction mixture was evaporated to dryness under reduced pressure.

4-dimethylaminopyridine (25.5 mg, 0.21 mmol), the third compound (160.5 mg, 0.45 mmol), triethylamine (304.9 mg, 3.01 mmol), and then THF (8.6 mL) are added to the residual mixture.

The reaction mixture was refluxed under Ar for 16 minutes.

After the reaction mixture is poured into water and extracted for 3 times with $CH_2Cl_2$, combined organic extracts are washed with brine, dried with $Na_2SO_4$, and evaporated to dryness under reduced pressure.

Residue is subjected to column chromatography on silica gel using hexane/AcOEt (5/1 v/v), and then size exclusion chromatography (SEC) is carried out cyclically; and the residue is recrystallized from EtOH to separate out orange powder of the first compound.

Figure 3:
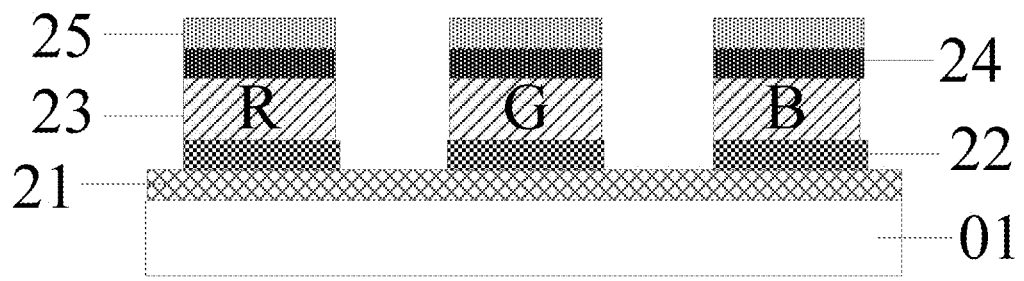
FIG. 3 is a specific structural diagram of an organic electroluminescent device layer provided by an embodiment of the present disclosure.

Optionally, in the display panel provided by the embodiment of the present disclosure, the specific structure of the organic electroluminescent device layer, as shown in FIG. 3, includes a third electrode 21, hole transport layers 22, light-emitting layers 23, electron transport layers 24 and fourth electrodes 25 which are successively located on the substrate 01, where the fourth electrodes 25 are arranged in an array; and the third electrode 21 can be disposed on the entire surface. The organic electroluminescent device layer has the same specific structure and manufactured through the same method as an organic electroluminescent display panel in the related art, and will not be described in detail herein.

After the organic electroluminescent device layer is manufactured, a first insulating layer, the detection sensor corresponding to each sub-pixel, and a second insulating layer are successively formed on a side of the organic electroluminescent device layer away from the base substrate, where the first insulating layer and the second insulating layer are arranged to insulate the organic electroluminescent device layer, the detection sensor and the color switchable structure from each other.

A manufacturing process of the color switchable structure is as follows: the first electrode layer and the first alignment layer were successively formed on a side of the second insulating layer away from the base substrate, and the cholesteric liquid crystals doped with the single-electro oxidant and the first compound were added dropwise to a liquid crystal cell, where the cholesteric liquid crystals doped with the first compound with the concentration of 2.2 mol % were added dropwise in a region for displaying red light, and the cholesteric liquid crystals doped with the first compound with the concentration of 3.0 mol % were added dropwise in regions for displaying blue and green; and then another substrate with a second electrode and a second alignment layer successively formed thereon was aligned to a side added with the cholesteric liquid crystals dropwise, thus forming the whole display panel.

Figure 4:
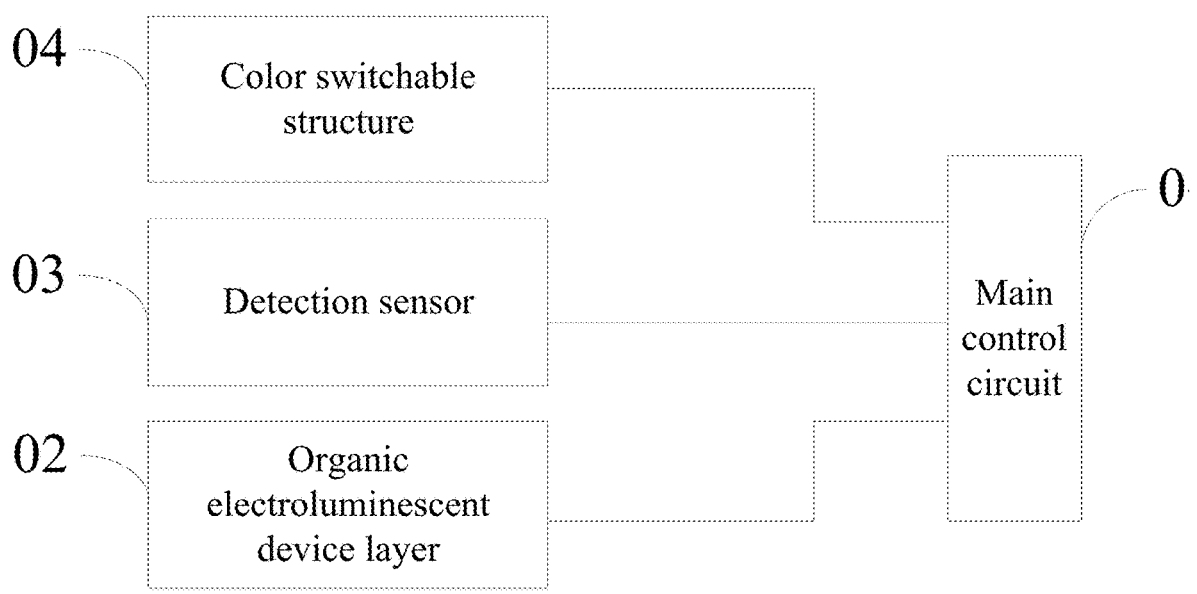
FIG. 4 is a schematic structural diagram of a display device provided by an embodiment of the present disclosure.

Based on the same inventive concept, an embodiment of the present disclosure further provides a display device, as shown in FIG. 4, including the display panel provided by any foregoing embodiment, and a main control circuit 06.

The main control circuit 06 is electrically connected with the organic electroluminescent device layer 02, the detection sensor 03 and the color switchable structure 04, respectively.

The main control circuit 06 is configured to receive a detection signal provided by the detection sensor 03, and control display states of the organic electroluminescent device layer 02 and the color switchable structure 04 according to the detection signal.

The display device has all the advantages of the display panel provided by any foregoing embodiment. The display panel portion of the display device can be implemented by referring to the display panel provided by the foregoing embodiment, and will not be described in detail herein.

Figure 5:
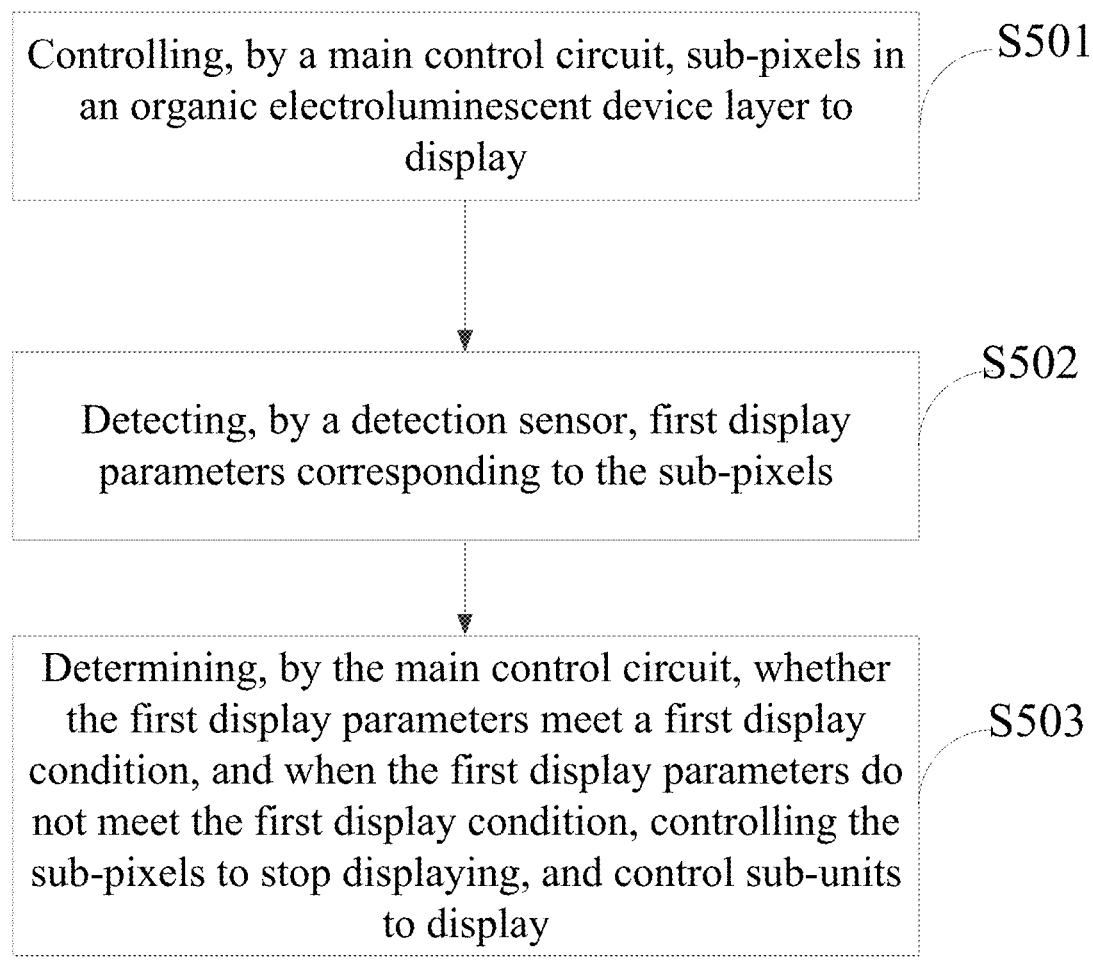
FIG. 5 is a flow diagram of a display method for a display device provided by an embodiment of the present disclosure.

Based on the same inventive concept, an embodiment of the present disclosure further provides a display method for the display device, as shown in FIG. 5, including the following steps.

S501. the main control circuit controls the sub-pixels in the electroluminescent device layer to display.

S502. the detection sensor detects the first display parameters corresponding to the sub-pixels.

S503. the main control circuit determines whether the first display parameters meet the first display condition or not, and when the first display parameters do not meet the first display condition, controls the sub-pixels to stop displaying, and controls the sub-units to display.

Specifically, in the display method for the display device provided by the embodiment of the present disclosure, after start-up of the display device, the main control circuit controls the sub-pixels in the organic electroluminescent device layer to display, and controls the detection sensor to detect the first display parameters of the sub-pixels, and when the first display parameters of the sub-pixels in the organic electroluminescent device layer do not meet the first display condition, the main control circuit controls the organic electroluminescent device layer to stop displaying, and controls the sub-units in the color switchable structure to display. That is, with the structure of the display panel and the control of the main control circuit, after attenuation of the service life of the organic electroluminescent device layer, the display device can still use the color switchable structure for display, thereby prolonging the service life of the display device.

Optionally, in the display method for the display device provided by the embodiment of the present disclosure, when the first parameters are first brightness values corresponding to the the sub-pixels, determining, by the main control circuit, whether the first display parameters meet the first display condition or not, specifically including: determining, by the main control circuit, whether the first brightness values are smaller than a first threshold or not; and when the first brightness values are smaller than the first threshold, controlling, by the main control circuit, the sub-pixels to stop displaying, and controlling the sub-units to display.

Specifically, in the display method for the display device provided by the embodiment of the present disclosure, the detection sensor can detect the first brightness value of each sub-pixel in the electroluminescent device layer, and when the first brightness values are less than the preset threshold, it is determined that the sub-pixels in the electroluminescent device layer cannot perform normal display, and the main control circuit controls the sub-units in the color switchable structure to display.

Setting of the first threshold is determined according to the requirement for the display brightness values in application scenarios of the display device; that is, it can be selected according to the actual use situation, which is not specifically limited herein.

Optionally, in the display method for the display device provided by the embodiment of the present disclosure, the method further includes: after the sub-units have performed display for the preset period of time, controlling, by the main control circuit, the detection sensor to detect second display parameters corresponding to sub-units for displaying blue; determining, by the main control circuit, whether the second display parameters corresponding to the sub-units for displaying blue meets the second display condition or not; and when the second display parameters do not meet the second display condition, switching the signals applied to the sub-units for displaying blue and sub-units for displaying green.

Specifically, in the display method for the display device provided by the embodiment of the present disclosure, the service life of each sub-unit can also be attenuated, especially for the sub-unit for displaying the blue light. Due to the large energy level transition of the blue light, its attenuation rate is higher than that of the sub-units for other colors. As each sub-unit can display the corresponding color under the drive of a corresponding voltage, the voltage applied between the blue sub-units and the green sub-units can be switched so that the sub-unit originally displaying green displays blue, thereby prolonging the service life of the display device again.

Specifically, for example, red is displayed when the voltage of 1.5 V is applied to the sub-units for displaying the red light. As the sub-units for displaying blue and green have the same structure and doping concentration, green is displayed when the voltage of 1.5 V is applied thereto, and blue is displayed when the voltage of 0 V is applied thereto. When the blue sub-unit is insufficient to meet the display requirement due to attenuation, the voltages can be switched; that is, the sub-unit originally displaying green is applied with the voltage of 0 V for displaying blue, and the sub-unit originally displaying blue is applied with the voltage of 1.5 V for displaying green, so that the display requirement of the display device can still be met, thereby prolonging the display life of the display device.

The display device provided by the present disclosure can achieve switching of the displayed colors mainly because the NOBF4 (single-electron oxidant) is added to the 3.0 mol % cholesteric liquid crystals doped with a chiral compound (first compound). When the voltage applied to the unit is 1.5 V, ferrocene in the doped chiral compound is oxidized, so that its spiral twisting force is reduced by 13%, so the reflected light of the sub-unit changes from blue to green within 0.4 s. When the voltage of 0 V is applied to the sub-unit, the reflected light switches to the original blue within 2.7 s. With the NOBF4 (single-electron oxidant) added to the 2.2 mol % cholesteric liquid crystals doped with the chiral compound, when the voltage of 1.5 V is applied to the sub-unit, the reflected light of the sub-unit is red within 0.4 s and switched to blue within 2.7 s.

The wavelengths of three materials corresponding to R (red), G (green) and B (blue) are not all the same, where the wavelengths of the G and B light-emitting layers are smaller, and the wavelength of the R light-emitting layer is larger. Thus, with all the materials placed in the panel, in the case of the same thickness of the light-emitting layers, to achieve the same brightness of B, G and R, a larger current must be used for driving, which can lead to increased heat and power consumption, and shorten the life of the B and G (especially the B). However, the R with the longer wavelength needs a smaller driving current, and the life of the R is longer than that of the G and B. Therefore, after emitting the light, the red sub-unit in the present disclosure directly outputs the red reflected light, and the detection sensor does not detect and scan the R sub-unit, which is not involved in color switching, and only the G and B sub-units with shorter lives are switched to achieve the purpose of prolonging the life of the display device.

Optionally, in the display method for the display device provided by the embodiment of the present disclosure, when the second display parameter is the second brightness value corresponding to the sub-units for displaying blue, determining, by the main control circuit, whether the second display parameter corresponding to the sub-units for displaying blue meets the second display condition or not, specifically including: determining, by the main control circuit, whether the second brightness values are smaller than the second threshold or not; and when the second brightness values are smaller than the second threshold, switching the signals applied to the sub-units for displaying blue and the sub-units for displaying green.

Specifically, in the display method for the display device provided by the embodiment of the present disclosure, the detection sensor can detect the second brightness value of each sub-unit, and when the second brightness value of the sub-unit for displaying blue is smaller than the second threshold, the signals applied to the sub-unit for displaying blue and the sub-unit for displaying green are switched, thereby prolonging the service life of the display device.

Setting of the second threshold is determined according to the requirement for the display brightness values in the application scenarioes of the display device; that is, it can be selected according to the actual use situation, which is not specifically limited herein.

Optionally, in the display method for the display device provided by the embodiment of the present disclosure, the method further includes: while controlling the sub-units to display, driving, by the main control circuit, the sub-units to display the light with a same color as corresponding sub-units.

Specifically, in the display method for the display device provided by the embodiment of the present disclosure, the sub-units and the sub-pixels perform display simultaneously. According to the light constructive principle, the display device in this case can have more bright colors with a higher color gamut, thereby not only prolonging the service life of the display device, but also increasing the display color gamut of the display device.

The embodiments of the present disclosure provide the display panel, the display device and the display method therefor. The display panel includes the base substrate, and the organic electroluminescent device layer, the detection sensor and the color switchable structure which are successively located on the base substrate and are insulated from each other, where the organic electroluminescent device layer includes the plurality of sub-pixels, and the color switchable structure includes the sub-units disposed in one-to-one correspondence with the sub-pixels; the sub-units are configured to transmit the light emitted by the sub-pixels under the control of the applied different signals, or to display the light of the colors corresponding to the applied signals; and the detection sensor is configured to detect the display parameters of the sub-pixels or the sub-units. For the display panel with the aforementioned structure, the sub-pixels in the organic electroluminescent device layer can be controlled to be lit up first, and when the detection sensor detects that the first display parameters of the sub-pixels do not meet the first display condition, the sub-units in the color switchable structure are controlled to perform display, thereby achieving the purpose of prolonging the service life of the display panel.

Obviously, those skilled in the art can make changes and modifications to the present disclosure without departing from the spirit and scope of the present disclosure. Thus, the present disclosure is also intended to encompass these changes and modifications if such changes and modifications of the present disclosure are within the scope of the claims of the present disclosure and equivalents thereof.

The invention claimed is:
1. A display panel, comprising:
a base substrate, and
an organic electroluminescent device layer, a detection sensor and a color switchable structure successively located on the base substrate and insulated from each other, wherein
the organic electroluminescent device layer comprises a plurality of sub-pixels;
the color switchable structure comprises a plurality of sub-units disposed in one-to-one correspondence with the plurality of sub-pixels;
the plurality of sub-units are configured to transmit light emitted by the plurality of sub-pixels under control of applied different signals, or to display light of colors corresponding to applied signals;
the detection sensor is configured to detect display parameters of the plurality of sub-pixels or the plurality of sub-units; and
the color switchable structure further comprises: a first electrode layer, a first alignment layer, a cholesteric liquid crystal layer, a second alignment layer and a second electrode layer successively located on a side of the detection sensor away from the base substrate;
wherein the second electrode layer comprises a plurality of electrodes arranged in an array, and the plurality of electrodes are respectively disposed corresponding to the plurality of sub-units; and
the cholesteric liquid crystal layer is doped with a single-electron oxidant and a first compound that influences spiral shapes of liquid crystal molecules, and concentrations of the first compound doped in the cholesteric liquid crystal layer corresponding to the plurality of sub-units for displaying different colors are not all the same.

2. The display panel according to claim 1, wherein a concentration of the first compound doped in the cholesteric liquid crystal layer corresponding to sub-units for displaying red is 2.2 mol %; and
a concentrations of the first compound doped in the cholesteric liquid crystal layer corresponding to sub-units for displaying green and blue are both 3.0 mol %.

3. The display panel according to claim 1, wherein the single-electron oxidant comprises NOBF4.

4. The display panel according to claim 1, wherein the first compound comprises:

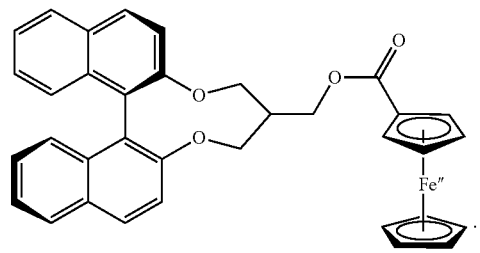

5. A display device, comprising a display panel and a main control circuit, wherein the display panel comprises:
a base substrate, and
an organic electroluminescent device layer, a detection sensor and a color switchable structure successively located on the base substrate and insulated from each other, wherein
the organic electroluminescent device layer comprises a plurality of sub-pixels;

the color switchable structure comprises a plurality of sub-units disposed in one-to-one correspondence with the plurality of sub-pixels;

the plurality of sub-units are configured to transmit light emitted by the plurality of sub-pixels under control of applied different signals, or to display light of colors corresponding to applied signals;

the detection sensor is configured to detect display parameters of the plurality of sub-pixels or the plurality of sub-units; and the color switchable structure further comprises: a first electrode layer, a first alignment layer, a cholesteric liquid crystal layer, a second alignment layer and a second electrode layer successively located on a side of the detection sensor away from the base substrate;

wherein the second electrode layer comprises a plurality of electrodes arranged in an array, and the plurality of electrodes are respectively disposed corresponding to the plurality of sub-units; and the cholesteric liquid crystal layer is doped with a single-electron oxidant and a first compound that influences spiral shapes of liquid crystal molecules, and concentrations of the first compound doped in the cholesteric liquid crystal layer corresponding to the plurality of sub-units for displaying different colors are not all the same;

wherein the main control circuit is electrically connected to the organic electroluminescent device layer, the detection sensor and the color switchable structure, respectively; and the main control circuit is configured to receive a detection signal provided by the detection sensor, and control display states of the organic electroluminescent device layer and the color switchable structure according to the detection signal.

* * * * *